United States Patent
Deppe et al.

(10) Patent No.: US 7,656,213 B2
(45) Date of Patent: Feb. 2, 2010

(54) GENERATING A PULSE SIGNAL WITH A MODULATED DUTY CYCLE

(75) Inventors: Carsten Deppe, Aachen (DE);
Christian Hattrup, Wurselen (DE)

(73) Assignee: Koninklijke Philips Electronics, N.V., Eindhoven (NL)

( * ) Notice: Subject to any disclaimer, the term of this patent is extended or adjusted under 35 U.S.C. 154(b) by 143 days.

(21) Appl. No.: 12/066,513

(22) PCT Filed: Sep. 12, 2006

(86) PCT No.: PCT/IB2006/053224

§ 371 (c)(1),
(2), (4) Date: Mar. 12, 2008

(87) PCT Pub. No.: WO2007/031940

PCT Pub. Date: Mar. 22, 2007

(65) Prior Publication Data

US 2008/0252351 A1    Oct. 16, 2008

(30) Foreign Application Priority Data

Sep. 16, 2005   (EP)   ................... 05108521

(51) Int. Cl.
*H03K 3/00*   (2006.01)
*H03K 7/08*   (2006.01)
(52) U.S. Cl. ........................ 327/291; 327/175
(58) Field of Classification Search .............. 327/160, 327/164–166, 172–176, 291
See application file for complete search history.

(56) References Cited

U.S. PATENT DOCUMENTS

| 5,206,889 | A   |   | 4/1993  | Unkrich |
| 7,106,118 | B2  | * | 9/2006  | Tang et al. ................... 327/291 |
| 7,567,108 | B2  | * | 7/2009  | Tang et al. ................... 327/291 |
| 2003/0117118 | A1 |   | 6/2003 | Imai et al. |
| 2003/0189505 | A1 |   | 10/2003 | Okamoto |
| 2004/0120395 | A1 | * | 6/2004 | Orr et al. ..................... 375/237 |

FOREIGN PATENT DOCUMENTS

WO    2004055964 A1    7/2004

OTHER PUBLICATIONS

M. Murshidul Islam et al; "A Low-Cost Digital Controller for a Switching DC Converter With Improved Voltage Regulation", IEEE Power Electronics Letters, vol. 2, No. 4, Dec. 2004.

* cited by examiner

*Primary Examiner*—Lincoln Donovan
*Assistant Examiner*—Patrick O'Neill

(57) ABSTRACT

Generating an output pulse signal (Y), which has an output signal period ($T_y$), which is divided by a magnitude transition into a leading part (LP) and a trailing part (TP). During each output signal period ($T_y$) altering means (27 to 36) determine in a coarse and fine way a duration ($T_{LP}$, $T_{TP}$) of one or both of said output signal period parts (LP, TP) by using a clock signal (Cx) of different clock cycle durations ($T_{Cx0}$, $T_{Cx1}$, $T_{Cx2}$), dependent on a value of a first digital number (D1) and a value of second, less significant digital number (D3, D5), respectively.

9 Claims, 4 Drawing Sheets

GENERATING A PULSE SIGNAL WITH A MODULATED DUTY CYCLE

FIELD OF THE INVENTION

The invention relates to a method for generating a pulse signal as described in the preamble of claim 1 and to a pulse signal generator as described in the preamble of claim 6.

BACKGROUND OF THE INVENTION

US 2003/0117118 discloses a method and a circuit to provide an output pulse signal with a modulated pulse width with increased accuracy for small values of a digital input number which determines a duration of a width of a pulse of the output signal. The output pulse signal is used to control a switching power supply for a DC load. According to the reference, without taking measurements, a resolution of a location of transition of a leading part and a trailing part of the output signal period would be constant for all values of an input digital number. That is, the resolution is determined by a duration of a period of a modulation clock pulse signal. In that case, if the value of the digital number is small, a change thereof by a small amount will have much more effect by percentage than changing a large value of the digital number by the same amount. For several applications, such as for accurate control of a switching power supply, this may be unwanted. Therefore, the reference discloses, for small values of the digital number, to extend or not the width of a pulse of output signal periods by one or more modulation clock pulse periods. To achieve that, clock pulses of different clock signals are counted and counted numbers are divided by each other to provide a whole result and a remainder result to therewith determine the times on which the width of the output signal pulses must be changed or not.

The prior art method is complex, difficult and expensive to implement and, more important, it does not provide an increase of resolution for relatively large values of the digital input number.

OBJECT OF THE INVENTION

It is an object of the invention to solve the drawbacks of the prior art as described above.

SUMMARY OF THE INVENTION

The above object of the invention is achieved by providing a method as described in claim 1.

Accordingly, by the addition of a less significant digital input number, transitions of many output pulse cycles can be shifted by smaller amounts of time than before and the resolution of the duty cycle of the output signal is increased for a range of larger digital input values than before. The method as provided by the invention is simple and it can be implemented easily and cost effective by using hardware and/or software.

The above object of the invention is achieved also by providing a pulse signal generator as described in claim 6.

BRIEF DESCRIPTION OF THE DRAWINGS

The invention will become more gradually apparent from the following exemplary description in connection with the accompanying drawing. In the drawing.

DETAILED DESCRIPTION OF EXAMPLES

Figure 1:
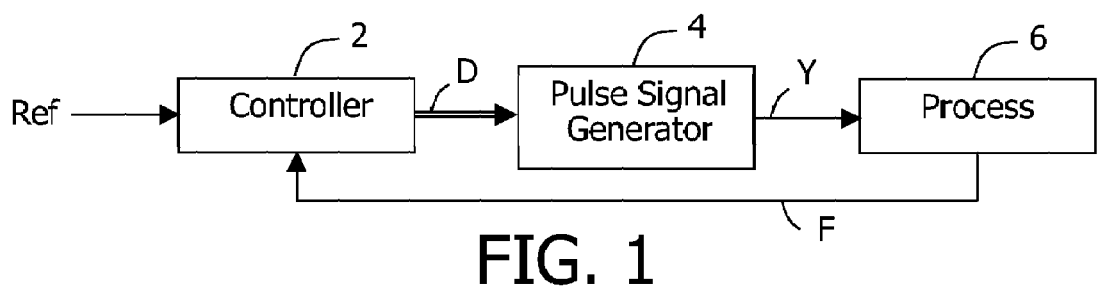
FIG. 1 shows a diagram of a system in which the invention can be applied.

The system shown in FIG. 1 has a well-known configuration and it is to illustrate an example which is suitable for applying the invention.

The system of FIG. 1 comprises a controller 2, a pulse signal generator 4 and a process 6. The process 6 is supplied with an output pulse signal Y from the generator 4 for controlling the process 6. At its input the process 6 may have a switch which is controlled by the pulse signal Y, for example to control power supplied to a load of the process 6. The process 6 may have a low pass filter connected in series between said switch and said load to therewith provide, in combination with generator 4, a digital-to-analogue converter (DAC).

The controller 2 is supplied with a reference entity (a signal or a value) Ref and a feedback entity F supplied by the process 6. Dependent on values of the reference entity Ref and the feedback entity F the controller 2 determines a digital number D, which will control the process 6 through the generator 4 to change the value of the feedback entity F.

The controller 2 supplies the digital number D to the generator 4. The generator 4 determines a duty cycle of its output pulse signal Y dependent on a value of the digital number D. Just like other variables used in here, D itself may indicate both the entity and its value.

Figure 2:
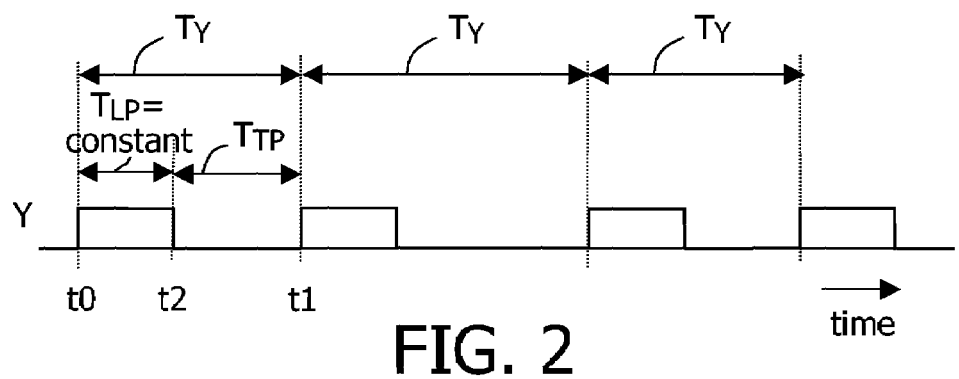
FIG. 2 shows a time diagram of a first example of a pulse signal with a modulated duty cycle occurring in the system of FIG. 1.
Figure 3:
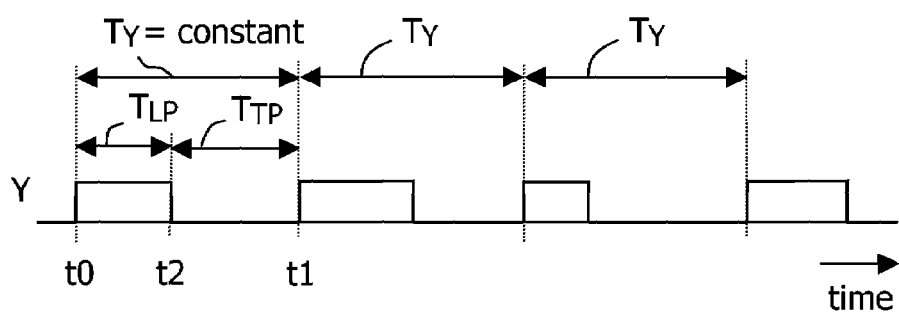
FIG. 3 shows a time diagram of a second example of a pulse signal with a modulated duty cycle occurring in the system of FIG. 1.

As shown in FIGS. 2 and 3, with the output pulse signal Y having an output signal period $T_Y$, said period $T_Y$ is determined by transitions of its magnitude between adjacent periods $T_Y$ and by a transition in between. The transitions divide the period $T_Y$ into a leading part LP having a duration $T_{LP}$ and a trailing part TP having a duration $T_{TP}$.

The duty cycle of the output pulse signal Y may be changed in different ways. Either or both the leading part LP and trailing part TP of the output signal period $T_Y$ may be altered.

According to the example of FIG. 2 the duration of one part, for example the duration $T_{LP}$ of the leading part LP, is remained constant and the duration ($T_{TP}$) of the other (trailing) part (TP), and therewith the duration $T_Y$ of the output pulse signal Y, may be varied, in particular dependent on the value of the digital number D.

According to the example of FIG. 3 the duration of one part, for example the duration $T_{LP}$ of the leading part LP, may be varied, in particular dependent on the value of the digital number D. The duration $T_Y$ of the output pulse signal Y is remained constant, so that the duration ($T_{TP}$) of its other (trailing) part (TP) is varied accordingly without specific action being required.

To cover all possibilities of the leading part LP and/or the trailing part TP of the output signal period $T_Y$ being varied, such varying will be referred to as modulation of the duty cycle of the output pulse signal Y, with the duration of its period $T_Y$ being constant or not.

Figure 4:
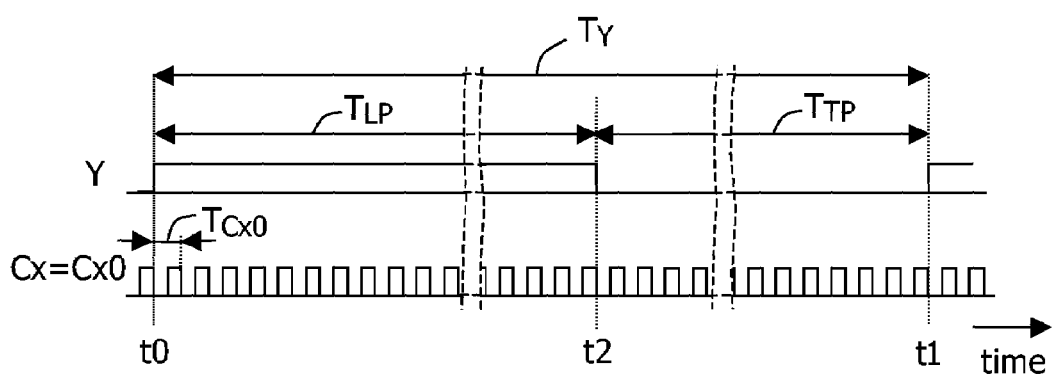
FIG. 4 shows a time diagram of a pulse signal with a modulated duty cycle in relation with a clock signal by which it is generated.

The duty cycle of the output pulse signal Y can be modulated in several ways. FIG. 4 shows an example in which a clock signal Cx is used which has a much higher frequency than the output pulse signal Y. That is, the clock signal has a period $T_{Cx}$ with a duration which is much smaller than the duration of the output signal period $T_Y$. The clock period $T_{Cx}$ has a nominal duration $T_{Cx0}$. With said period $T_Y$ being defined by a starting point at t0 and a finishing point at t1, the duration $T_{LP}$ of the leading part LP and/or the duration $T_{TP}$ of the trailing part TP can be defined by counting the number of clock cycles from t0 or from a point t2 of a transition of the output signal Y between t0 and t1 until a specific count, dependent on the digital number D, is reached upon which the transition at t2 or at t1, respectively, of the output signal Y is made.

Figure 5:
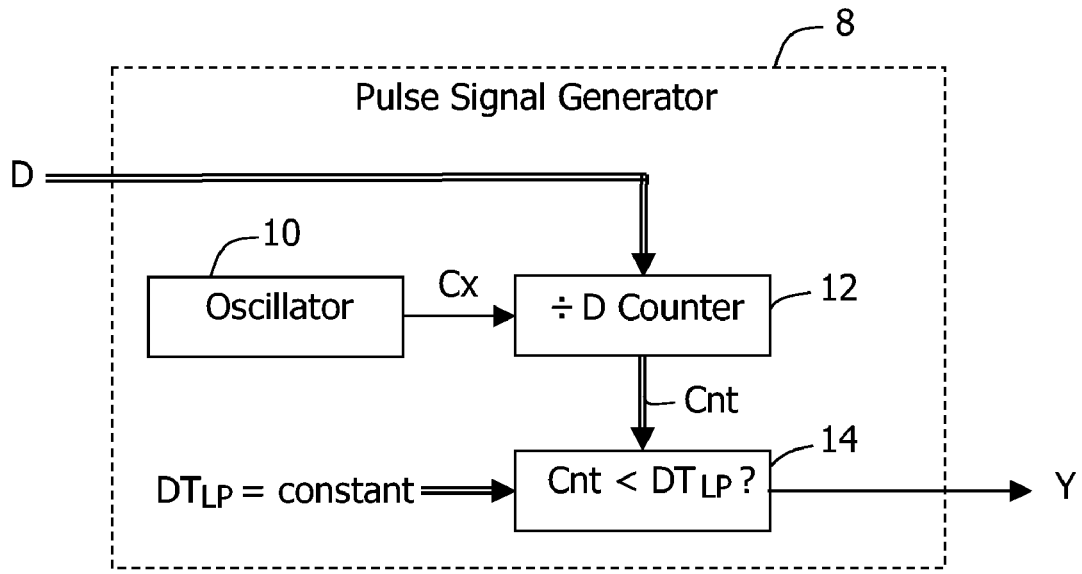
FIG. 5 shows a diagram of an embodiment of a generator for generating the pulse signal shown in FIG. 2.

FIG. 5 shows a diagram of a pulse signal generator 8 as a first example of generator 4 of FIG. 1. Generator 8 is for generating the pulse signal Y illustrated in FIG. 2. Generator 8 comprises an oscillator 10, a programmable counter 12 and a comparator 14. The oscillator 10 supplies a clock signal Cx to a clock input of the counter 12. The digital number D is supplied to a preset input of counter 12 to program a counting range of the counter 12. A count output Cnt of counter 12 is supplied to a first data input of comparator 14. A second data input of comparator 14 is supplied with a digital number $DT_{LP}$ with a constant value. If comparator 14 determines that Cnt is smaller than $DT_{LP}$ it will supply the output signal Y with a first magnitude (such as a high level) and with a second, different magnitude (such as a low level) otherwise.

Figure 6:
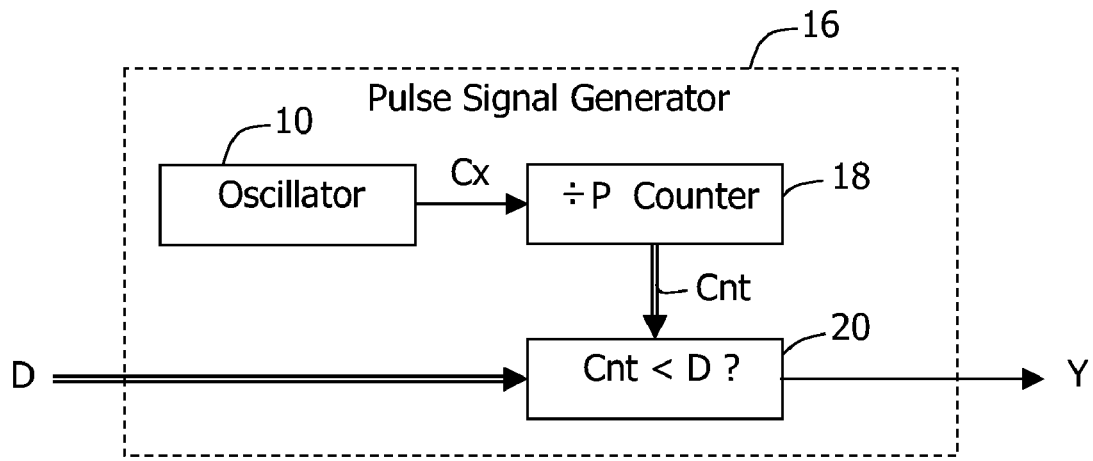
FIG. 6 shows a diagram of an embodiment of a generator for generating the pulse signal shown in FIG. 3.

FIG. 6 shows a diagram of a pulse signal generator 16 as a second example of generator 4 of FIG. 1. Generator 16 is for generating the pulse signal Y illustrated in FIG. 3. Generator 16 comprises an oscillator 10, a counter 18 and a comparator 20. The oscillator 10 supplies a clock signal Cx to a clock input of the counter 18. The counter 18 has a fixed counting range of P clock cycles. Counting P clock pulses takes a time which equals the output signal period $T_Y$, with $T_Y = P \times T_{Cx}$. A count output Cnt of counter 18 is supplied to a first data input of comparator 14. A second data input of comparator 20 is supplied with the digital number D. If comparator 20 determines that Cnt is smaller than D it will supply the output signal Y with a first magnitude (such as a high level) and with a second, different magnitude (such as a low level) otherwise.

A resolution of a controlled location at t1 (FIGS. 3 and 6) or t2 (FIGS. 2 and 5) of a transition of the output signal Y, that is a resolution of its duty cycle, is dependent on the resolution of the digital number D, in particular of the number of bits thereof. For increasing the resolution by a factor G or $^2$log(G) bits, the clock frequency must be increased by the same factor G. In many cases it is not practical or too expensive to increase the clock frequency above some value, dependent on the case, and one must content oneself with a smaller resolution than really wanted. The inventors have recognized that in several of these cases one does not need modulation of the duty cycle over its full range from 0% to 100%, and that an unused part of said range can be used to allow a change of the clock frequency for a limited number of clock cycles for fine tuning the modulation of the duty cycle of the output pulse signal by using a second, less significant digital number. Examples of implementations thereof will be described with reference to FIGS. 7 and 9, which are based on generators 8 and 16 shown in FIGS. 5 and 6 respectively.

Figure 7:
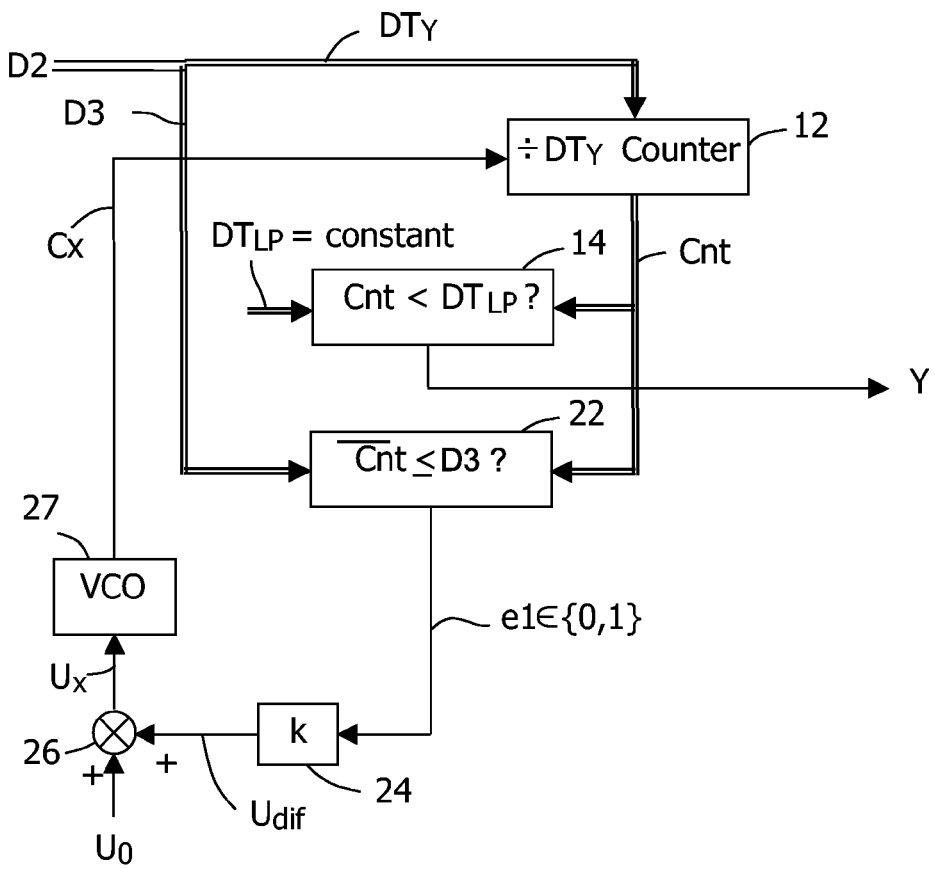
FIG. 7 shows a diagram of an embodiment of a generator according to the invention for generating the pulse signal shown in FIG. 2 with coarse and fine locating of a transition of each period of said pulse signal.

FIG. 7 shows a circuit diagram of a first embodiment of a pulse signal generator according to the invention. The circuit shown in FIG. 7 comprises in addition to the circuit shown in FIG. 5 a comparator 22, a multiplier (or amplifier) 24, and an adder 26. Oscillator 10 of FIG. 5 is a voltage controlled oscillator (VCO) 27 in FIG. 7. The operation of the circuit shown in FIG. 7 will now be described with reference to the time diagram of FIG. 8.

The digital input number D of FIG. 5 is extended to a number D2 of a part $DT_Y$ (identical to D of FIG. 5) and a less significant part D3. As with FIG. 5, D2 defines the output signal period $T_Y$.

Figure 8:
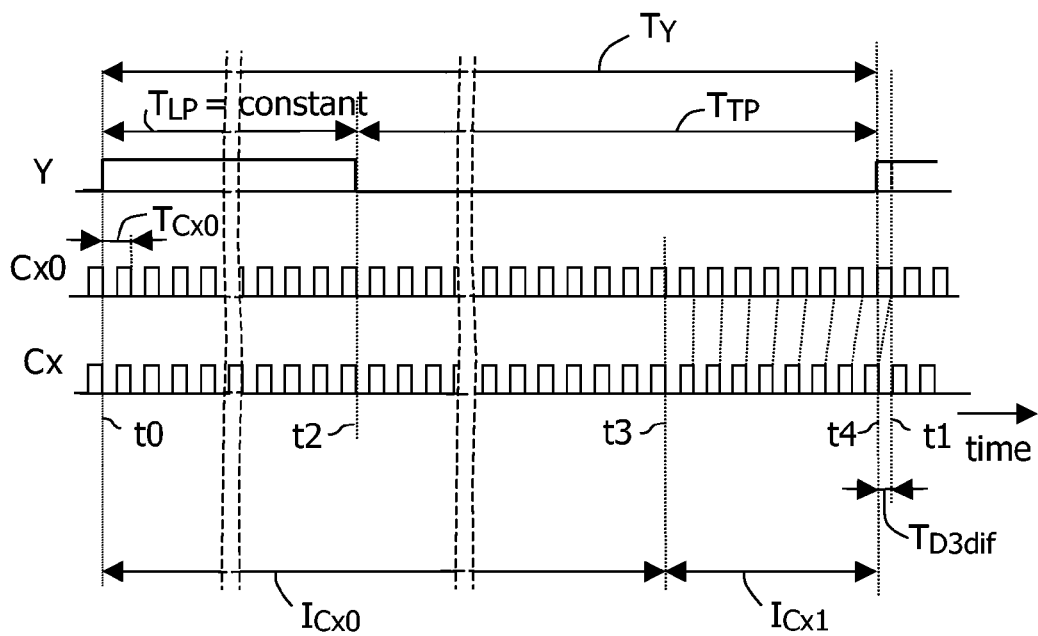
FIG. 8 shows a time diagram of signals occurring in the generator shown in FIG. 7.

After the transition from the leading part LP to the trailing part TP of the output signal period $T_Y$, the clock frequency is changed slightly for a number of cycles which is determined by the digital number D3. In here it is supposed that during the trailing part TP of the output signal period $T_Y$ the clock period duration $T_{Cx}$ is temporarily decreased from $T_{Cx0}$ to $T_{Cx1}$. In FIG. 8 the intervals with different clock frequencies are indicated by $I_{Cx0}$ for the nominal clock period $T_{Cx0}$ and by $I_{Cx1}$ for the decreased clock period $T_{Cx1}$. Preferably, the clock cycles with decreased duration are located at the end of the output pulse period $T_Y$. The first clock cycle thereof will then occur if the inverse of count Cnt is less than or equal to the number D3. Comparator 22 carries out such comparison. At the occurrence at a point of time t3 of the first clock cycle of which the frequency must be changed comparator 22 changes its output e1 from a low logical level (0) to a high logical level (1). The high level of e1 is remained until the counter 12 returns to zero count (Cnt=0). Output e1 of comparator 22 is multiplied (or amplified) by a factor k by multiplier 24 to provide a voltage $U_{dif}$. The adder 26 adds output voltage $U_{dif}$ from multiplier 24 to a constant voltage $U_0$ to provide a voltage $U_x$, which is supplied to a control input of the VCO 27. With $U_{dif}=0$ a control voltage of $U_x=U_0$ will control the VCO to supply a clock signal with a nominal period $T_{Cx}=T_{Cx0}$. From time point t3 the control voltage is changed such that the clock signal period is slightly decreased to $T_{Cx}=T_{Cx1}$ ($T_{Cx1} < T_{Cx0}$). As a result the transition at the end of the output signal period $T_Y$ is forwarded from point t1 to a point t4. The time difference $T_{D3dif}$ between t1 and t4 equals the number defined by D3 times the clock signal period difference:

$$T_{D3dif} = D3 \times (T_{Cx0} - T_{Cx1}) = D3 \times T_{dif}$$

With the method and circuit for providing an output signal Y with a modulated duty cycle as described with reference to FIGS. 7 and 8 according to the invention a small change $T_{dif}$ of the clock cycle duration $T_{Cx}$ may provide a great increase of resolution of the location of the transition at the end of the output signal period $T_Y$. For example, suppose that the digital number $DT_Y$ has a value to let the output signal period $T_Y$ last for a maximum of 250 clock cycles. Then, with the prior art a resolution of 1/250 would be obtained. To address this a digital input $DT_Y$ of $^2$log(250)=7.97 bits, or practically 8 bits, would be required. Now for the invention, suppose D3 indicates a number of 0 to 50, which can be addressed by 6 bits.

Then, although not required, assuming that $T_{Cx1}$ or $T_{dif}$ is constant for all D3 cycles, $T_{dif}=T_{Cx0}/50$. Further supposing that $DT_{LP}$ indicates that the leading part LP always lasts 50 clock cycles $T_Y$ must last for at least 50+50=100 clock cycles to allow fine locating of the transition at the end of the trailing part TP by the 6 bits of D3. Thus, for each of said remaining 150 clock cycles the transition at the end of the output signal period $T_Y$ can be adjusted by 0 to 50 steps, which provides a maximum of 150×50=7500 locations, so that the resolution is increased from 1/250 to 1/7500, which is equal to a resolution increase of $^2\log(7500)-^2\log(250)=12.87-7.97=4.9$ bits.

Figure 9:
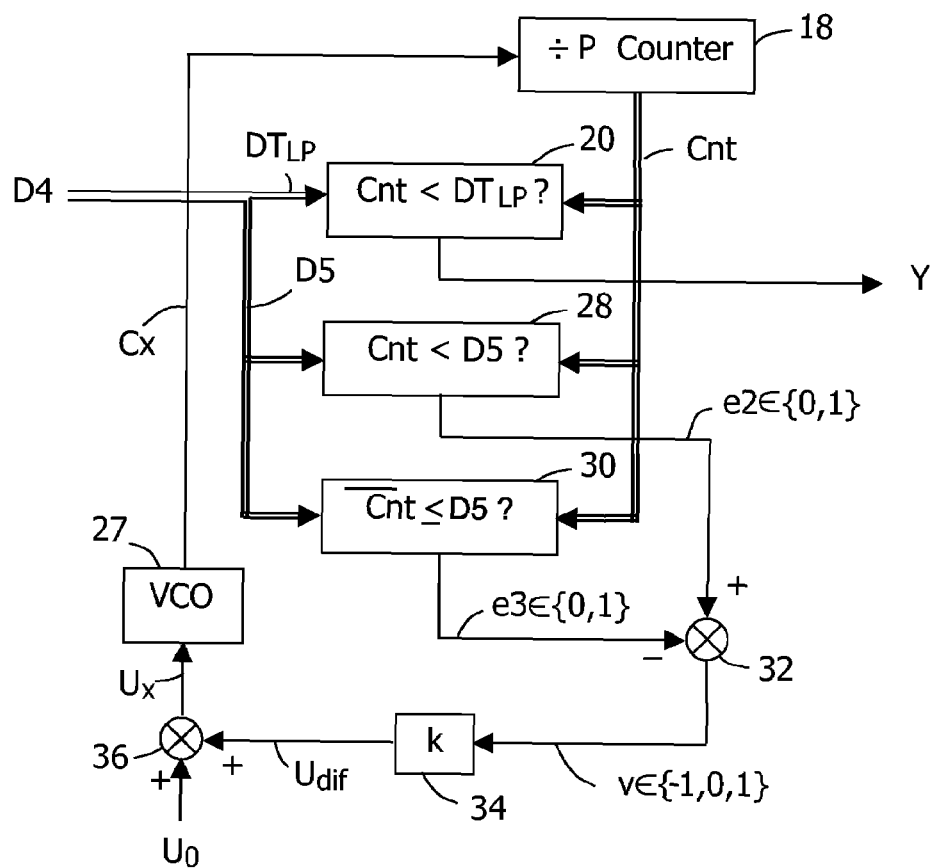
FIG. 9 shows a diagram of an embodiment of a generator according to the invention for generating the pulse signal shown in FIG. 3 with coarse and fine locating of a transition of each period of said pulse signal.

FIG. 9 shows a circuit diagram of a second embodiment of a pulse signal generator according to the invention. The circuit shown in FIG. 9 comprises in addition to the circuit shown in FIG. 6 a comparator 28, a comparator 30, a subtracting element 32, a multiplier (or amplifier) 34, and an adder 36. Oscillator 10 of FIG. 6 is a voltage-controlled oscillator (VCO) 27 in FIG. 9. The operation of the circuit shown in FIG. 9 will now be described with reference to the time diagram of FIG. 10.

The digital input number D of FIG. 6 is extended to a number D4 of a part $DT_{LP}$ (identical to D of FIG. 6) and a less significant part D5. As with FIG. 6, said part $DT_{LP}$ determines a number of clock cycles which the leading part LP of the output signal period $T_Y$ must last and the counting range of counter 18 is constant to determine that the output signal period $T_Y$ must always last for P clock pulses.

With the circuit shown in FIG. 9, during the leading part LP of the output signal period $T_Y$, the clock frequency is changed slightly for a number of cycles which is determined by the digital number D5. As a result, the duration $T_{LP}$ of the leading part will change dependent on the value of D5. This change of duration of the leading part LP is compensated during the trailing part TP of the same output signal period $T_Y$, such that the output signal period $T_Y$ is remained constant. It is supposed here that during the leading part LP the clock period duration $T_{Cx}$ is temporarily decreased from $T_{Cx0}$ to $T_{Cx1}$ and during the trailing part TP the clock frequency $T_{Cx}$ is temporarily increased from $T_{Cx0}$ to $T_{Cx2}$. In FIG. 9 the intervals with different clock frequencies are indicated by $I_{Cx0}$ for the nominal clock period $T_{Cx0}$, by $I_{Cx1}$ for the decreased clock period $T_{Cx1}$ and by $I_{Cx2}$ for the increased clock period $T_{Cx2}$. Preferably, the clock cycles with changed frequency with respect to the nominal clock frequency are located at the beginning and at end of the output pulse period $T_Y$, respectively.

For coarse locating of a transition during each output pulse period $T_Y$ the circuit of FIG. 9 operates the same as the circuit of FIG. 6. For fine location of said transition comparator 28 supplies an output e2 with a logical high level (1) if the count Cnt from counter 20 is smaller than the digital number D5 and with a low logical level (0) otherwise. To compensate for that, to remain $T_Y$ constant, during the trailing part TP of the output signal period $T_Y$, the comparator 30 supplies an output e3 with a logical high level (1) at the occurrence of the first clock cycle of which the duration must be increased from $T_{Cx0}$ to $T_{Cx2}$ and with a logical low level (0) otherwise.

The subtracting element 32 subtracts output e3 from comparator 30 from output e2 from comparator 28 to supply an analogue output v, which may take the values of −1, 0 and +1. The output v from the subtracting element 32 is multiplied by the multiplier (or amplifier) 34 by a factor k to supply a voltage $U_{dif}$. Adder 36 adds a constant voltage $U_0$ and the output voltage $U_{dif}$ from multiplier 34 to supply a voltage $V_x$, which is supplied to a control input of the VCO 27. If $U_{dif}$ is positive it will cause an increase of the clock frequency. If $U_{dif}$ is negative it will cause a decrease of the clock frequency. Accordingly, the clock period duration may change, if at all, by an amount of plus or minus $T_{dif}$.

Figure 10:
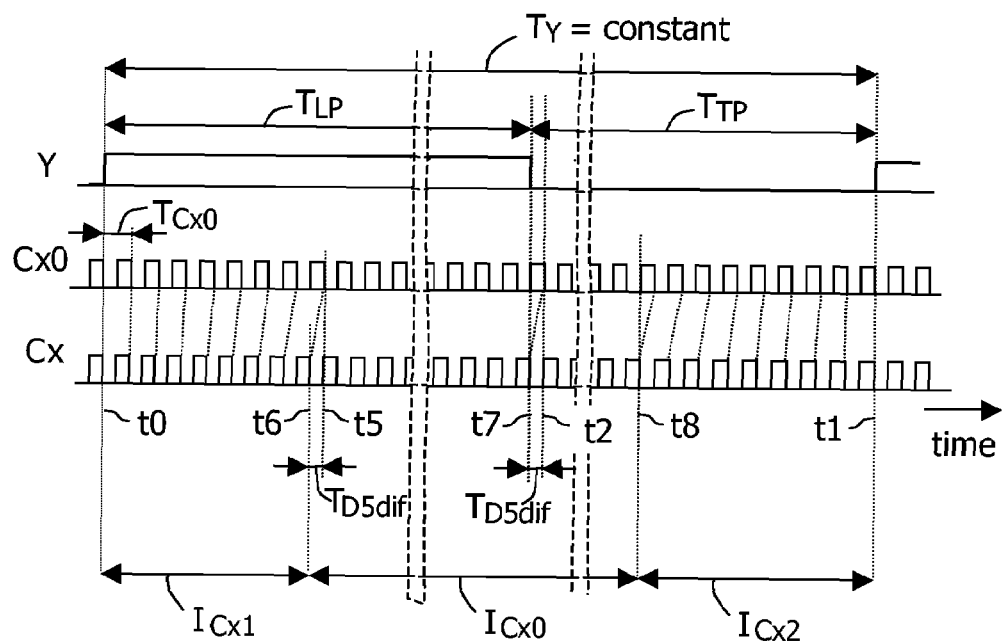
FIG. 10 shows a time diagram of signals occurring in the generator shown in FIG. 9.

As shown in FIG. 10, with the clock period duration being decreased for the first D5 clock cycles of the output signal period $T_Y$ from $T_{Cx0}$ to $T_{Cx1}$, the transition from the leading part LP to the trailing part TP of the output signal period $T_Y$ at t2 is advanced to t5 by an amount of $T_{D5dif}=D5\times(T_{Cx0}-T_{Cx1})=D5\times T_{dif}$. Similarly, the trailing edge of the last clock cycle with decreased duration $T_{Cx1}$ is advanced from t5 to t6 by the same amount $T_{D5dif}$. At t6 he clock period duration is restored to $T_{Cx0}$. When arriving at a time t8, which is determined by t2−D5×($T_{Cx0}+T_{dif}$), the clock period duration is temporarily increased to $T_{Cx2}$. At the end of the output signal period $T_Y$, at t1, the clock period duration is made $T_{Cx0}$ or $T_{Cx1}$, dependent on the value of D5 for the next output signal period $T_Y$ being zero or not zero, respectively.

With the method and circuit for providing an output signal Y with a modulated duty cycle as described with reference to FIGS. 9 and 10 according to the invention a small change $T_{dif}$ of the clock cycle duration $T_{Cx}$ may provide a great increase of resolution of the location of the transition from the leading part LP to the trailing part TP of the output signal period $T_Y$. For example, suppose P=250. Then, with the prior art a resolution of 1/250 would be obtained, which could be addressed by a digital input D1 of $^2\log(250)=7.97$ bits, or 8 bits in practice. Now for the invention, suppose D5 indicates a number of 0 to 50, which can be addressed by 6 bits. Then, although not required, assuming that $T_{Cx1}$ and $T_{Cx2}$ are constant for all D5 cycles, $T_{dif}=T_{Cx0}/50$. It takes another maximum of 50 clock cycles during the trailing part TP of the output signal period $T_Y$ to realize compensation of the advancing of the clock pulse sequence during the leading part LP. Therefore, during each output signal period $T_Y$, 250−50−50=150 clock cycles remain during which the transition from said leading part LP and the trailing part TP can be fine located by 0 to 50 steps. Thus, during those 150 clock cycles 150×50=7500 locations can be defined by $DT_{LP}$ and D5, so that the resolution is increased from 1/250 to 1/7500, which is equal to a resolution increase of $^2\log(7500)-^2\log(250)=12.87-7.97=4.9$ bits.

When not using the invention but changing the clock frequency in the usual way an increase of resolution would require an increase of the clock frequency by the same factor (4.9 in examples given with reference to FIGS. 7 to 10). The increase of the clock frequency may be impractical or too expensive to realize in many cases. With the invention a small temporarily increase or decrease (1/50 in the said examples) of a nominal clock frequency is sufficient to obtain the same result for many cases, that is, in cases with a limited modulation range of the duty cycle of the output signal Y.

It is observed that within the scope of the invention, as defined by the claims, a skilled person may apply several changes and modifications.

For example, with FIG. 7, multiplier 24 and adder 26 may together be formed by a single operational amplifier with two inputs for e1, and $U_0$ and with proper amplifications for those inputs. With FIG. 9, subtracting element 32, multiplier 34 and adder 36 may together be formed by a single operational amplifier with three inputs for e2, e3 and $U_0$ and with proper amplifications for those inputs.

Also, several of the components, such as counters and comparators, of the circuit diagrams of FIGS. 7 and 9 can be implemented by using software.

Further, VCO 27 can be implemented digitally instead, for example by using a microcontroller out of the product range MSP430 of manufacturer Texas Instruments, U.S.A. Then, instead of voltage $U_x$ a digital value is supplied to said microcontroller, the adder 26 or 36 can be a digital one and instead of voltages $U_0$ and $U_{dif}$ digital values can be used.

As noted above, a change of the clock period duration by $T_{dif}$ need not to be constant. The only requirement is that one can ultimately, by accumulation over a number (D3 in FIG. 7, D5 in FIG. 9) of clock cycles, advance or delay a specific transition of the output signal period $T_Y$.

Also, where in the description of the circuit examples according to the invention an increase or a decrease of the clock signal period duration are mentioned, the opposite is also possible.

In addition, operations explained above to take place during a leading part LP or during a trailing part TP of the output signal period $T_Y$ may be changed to take place in the other part in a similar fashion.

The invention claimed is:

1. A method for generating an output pulse signal (Y), which has an output signal period ($T_Y$), which is divided by a magnitude transition into a leading part (LP) and a trailing part (TP), in which during each output signal period ($T_Y$) a duration ($T_{LP}$, $T_{TP}$) of one of said output signal period parts (LP, TP) is determined by a value of a first digital number (D) times a period ($T_{Cx}$) of a modulation clock signal (Cx) with a nominal clock cycle duration ($T_{Cx}=T_{Cx0}$), characterized in that, during each output signal period ($T_Y$) a duration ($T_{LP}$, $T_{TP}$) of one or both of said output signal period parts (LP, TP) are determined in a coarse and a fine way by using a clock signal ($C_x$) of different clock cycle durations ($T_{Cx0}$, $T_{Cx1}$, $T_{Cx2}$), dependent on a value of a first digital number (D) and a value of a second, less significant digital number (D3, D5), respectively, wherein the second, less significant number temporarily increases and/or decreases the nominal clock cycle duration Tcx0 during a part of each output signal period Ty.

2. Method according to claim 1, characterized in that the second digital number (D3, D5) determines a time during which the clock cycle duration ($T_{Cx}$) has a value different from the nominal clock cycle duration ($T_{Cx0}$).

3. Method according to claim 2, characterized in that the time during which the clock cycle duration ($T_{Cx}$) has a value different from the nominal clock cycle duration ($T_{Cx0}$) is determined by counting the clock cycles ($T_{Cx1}$, $T_{Cx2}$) for a count which equals a value of the second digital number (D3, D5).

4. Method according to claim 1, characterized in that a clock cycle duration ($T_{Cx1}$, $T_{Cx2}$) which is different from the nominal clock cycle duration ($T_{Cx0}$) is applied right from or until a transition between adjacent output signal periods ($T_Y$) when using the different duration ($T_{Cx1}$, $T_{Cx2}$) during the leading part (LP) or the trailing part (TP) of the output signal period ($T_Y$), respectively.

5. Method according to claim 1, characterized in that if during one part (LP, TP) of the output signal period ($T_Y$) a clock cycle period ($T_{Cx1}$, $T_{Cx2}$) is used which is different from the nominal clock cycle period ($T_{Cx0}$), during the other part of the output signal period ($T_Y$) a clock cycle period ($T_{Cx1}$, $T_{Cx2}$) is used which is different from the nominal clock cycle period ($T_{Cx0}$) and from the clock cycle duration of said one part, such that the output signal period ($T_Y$) remains constant.

6. A pulse signal generator (8, 16) for generating an output pulse signal (Y), which has an output signal period ($T_Y$), which is divided by a magnitude transition into a leading part (LP) and a trailing part (TP), comprising output signal period part altering means (22 to 36) which determine a duration ($T_{LP}$, $T_{TP}$) of one of said output signal period parts (LP, TP) of each modulated signal period ($T_Y$) dependent on a value of a first digital number (D) times a period ($T_{Cx}$) of a modulation clock signal (Cx), characterized in that, during each output signal period ($T_Y$) the altering means determine in a coarse and fine way a duration ($T_{LP}$, $T_{TP}$) of one or both of said output signal period parts (LP, TP) by using a clock signal ($C_x$) of different clock cycle durations ($T_{Cx0}$, $T_{Cx1}$, $T_{Cx2}$), dependent on a value of the first digital number (D) and a value of a second, less significant digital number (D3, D5), respectively, wherein the second, less significant number temporarily increases and/or decreases the nominal clock cycle duration Tcx0 during a part of each output signal period Ty.

7. Pulse signal generator (8, 16) according to claim 6, characterized in that the altering means count clock cycles ($T_{Cx1}$, $T_{Cx2}$) having a duration which is different from the nominal clock cycle duration ($T_{Cx0}$) to define a time during which the different clock cycle duration ($T_{Cx1}$, $T_{Cx2}$) is used, which time corresponds to a counted number which equals a value of the second digital number (D3, D5).

8. Pulse signal generator (8, 16) according to claim 6, characterized in that the altering means apply a clock cycle duration ($T_{Cx1}$, $T_{Cx2}$) which is different from the nominal clock cycle duration ($T_{Cx0}$) right from or until a transition between adjacent output signal periods ($T_Y$) when using the different duration ($T_{Cx1}$, $T_{Cx2}$) during the leading part (LP) or the trailing part (TP) of the output signal period ($T_Y$), respectively.

9. Pulse signal generator (16) according to claim 6, characterized in that if the altering means (18, 20, 27 to 36) apply during one part (LP, TP) of the output signal period ($T_Y$) a clock cycle period ($T_{Cx1}$, $T_{Cx2}$) which is different from the nominal clock cycle period ($T_{Cx0}$), during the other part of the output signal period ($T_Y$) the altering means apply a clock cycle period ($T_{Cx1}$, $T_{Cx2}$) which is different from the nominal clock cycle period ($T_{Cx0}$) and from the clock cycle duration of said one part, such that the output signal period ($T_Y$) remains constant.

* * * * *